(12) United States Patent
Lee et al.

(10) Patent No.: US 9,640,661 B1
(45) Date of Patent: May 2, 2017

(54) FINFET HAVING A FIN AND A V-SHAPED EPITAXIAL LAYER FORMED ON THE TOP SURFACE OF THE FIN AND METHOD FOR FABRICATING THE SAME

(71) Applicant: UNITED MICROELECTRONICS CORP., Hsin-Chu (TW)

(72) Inventors: Kai-Lin Lee, Kinmen County (TW); Zhi-Cheng Lee, Tainan (TW); Yu-Hao Huang, Kaohsiung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/144,840

(22) Filed: May 3, 2016

(30) Foreign Application Priority Data

Apr. 6, 2016 (CN) .......................... 2016 1 0209522

(51) Int. Cl.
| H01L 27/088 | (2006.01) |
| H01L 29/78 | (2006.01) |
| H01L 29/66 | (2006.01) |
| H01L 21/311 | (2006.01) |
| H01L 29/06 | (2006.01) |

(52) U.S. Cl.
CPC ...... *H01L 29/785* (2013.01); *H01L 21/31111* (2013.01); *H01L 21/31116* (2013.01); *H01L 29/0649* (2013.01); *H01L 29/6653* (2013.01); *H01L 29/6656* (2013.01); *H01L 29/66795* (2013.01)

(58) Field of Classification Search
CPC ............. H01L 29/785; H01L 21/31111; H01L 21/31116; H01L 29/0649; H01L 29/6653; H01L 29/6656; H01L 29/66795
See application file for complete search history.

(56) References Cited

U.S. PATENT DOCUMENTS

| 7,045,407 | B2 | 5/2006 | Keating et al. | |
| 7,691,752 | B2 | 4/2010 | Ranade et al. | |
| 7,732,285 | B2 | 6/2010 | Sell et al. | |
| 8,779,513 | B2 * | 7/2014 | Tsai ...................... | H01L 29/785 257/347 |
| 8,993,384 | B2 * | 3/2015 | Hung .................. | H01L 29/7848 438/149 |
| 9,006,805 | B2 * | 4/2015 | Liao .................... | H01L 29/7848 257/288 |
| 2011/0193141 | A1 * | 8/2011 | Lin ....................... | H01L 29/785 257/347 |

\* cited by examiner

*Primary Examiner* — Stephen W Smoot
*Assistant Examiner* — Vicki B Booker
(74) *Attorney, Agent, or Firm* — Winston Hsu; Scott Margo

(57) ABSTRACT

A method for fabricating semiconductor device is disclosed. First, a substrate is provided, and a fin-shaped structure is formed on the substrate. Next, a gate structure is formed on the fin-shaped structure, and an epitaxial layer is formed adjacent to the gate structure. Preferably, the epitaxial layer includes a V-shaped profile viewing from the top. According to the preferred embodiment of the present invention, the V-shaped profile of the epitaxial layer allows more stress to be applied to the region having concentrated currents or edges of the fin-shaped structures during an on-state, and at the same time prevent exerting too much stress to the region having high currents or central region of the fin-shaped structure during an off-state.

12 Claims, 10 Drawing Sheets

FINFET HAVING A FIN AND A V-SHAPED EPITAXIAL LAYER FORMED ON THE TOP SURFACE OF THE FIN AND METHOD FOR FABRICATING THE SAME

BACKGROUND OF THE INVENTION

1. Field of the Invention

The invention relates to a semiconductor device, and more particularly, to an epitaxial layer having a V-shaped profile viewing from the top.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

However, epitaxial layers serving as primary stress-inducing structure in non-planar metal-oxide semiconductor (MOS) transistors, such as fin field effect transistors (FinFET) today are difficult to obtain an even distribution of electrical current under different conditions, thereby affecting the performance of the device. Hence, how to improve the current fabrication to resolve this issue has become an important task in this field.

SUMMARY OF THE INVENTION

According to a preferred embodiment of the present invention, a method for fabricating semiconductor device is disclosed. The method includes the steps of: providing a substrate; forming a fin-shaped structure on the substrate; forming a gate structure on the fin-shaped structure; and forming an epitaxial layer adjacent to the gate structure, in which the epitaxial layer includes a V-shaped profile viewing from the top.

According to another aspect of the present invention, a semiconductor device is disclosed. The semiconductor device includes: a substrate; a fin-shaped structure on the substrate; a gate structure on the fin-shaped structure; and an epitaxial layer adjacent to two sides of the gate structure, in which the epitaxial layer comprises a V-shaped profile viewing from the top.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
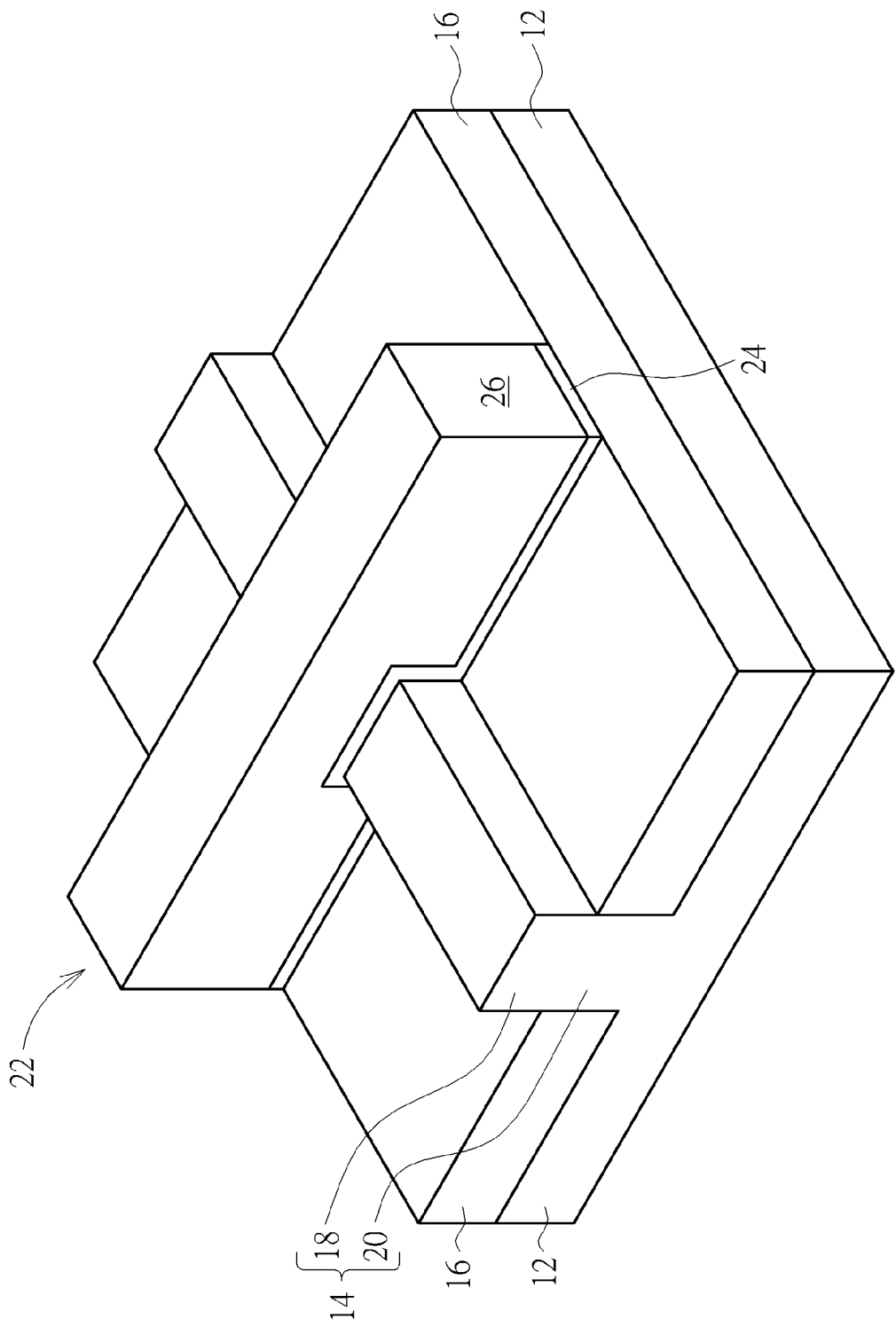
FIGS. 1-8 illustrate a method for fabricating semiconductor device according to a preferred embodiment of the present invention.

Referring to FIGS. 1-8, FIGS. 1-8 illustrate a method for fabricating semiconductor device according to a preferred embodiment of the present invention. As shown in FIG. 1, a substrate 12, such as silicon substrate or silicon-on-insulator (SOI) substrate is provided, at least one fin-shaped structure 14 is formed on the substrate 12, and a shallow trench isolation (STI) 16 is formed to surround the fin-shaped structure 14. In this embodiment, the fin-shaped structure 14 preferably includes a top portion 18 and a bottom portion 20, in which the intersection of the top portion 18 and bottom portion 20 is aligned with the top surface of STI 16. For instance, the bottom surface of the top portion 18 or the top surface of the bottom portion 20 is aligned with the top surface of the STI 16. Despite only one single fin-shaped structure 14 is disclosed in this embodiment, the quantity of the fin-shaped structure is not limited to the one disclosed in this embodiment. For instance, it would also be desirable to form one or more fin-shaped structures 14 on the substrate 12 according to the demand of the product.

The fin-shaped structure 14 of this embodiment is preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 of this embodiment could also be obtained by first forming a patterned mask (not shown) on the substrate, 12, and through an etching process, the pattern of the patterned mask is transferred to the substrate 12 to form the fin-shaped structure 14. Moreover, the formation of the fin-shaped structure 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure 14. These approaches for forming fin-shaped structure 14 are all within the scope of the present invention.

Next, a gate structure 22 is formed on the substrate 12 across the fin-shaped structure 14. In this embodiment, the formation of the gate structure 22 could be accomplished by sequentially depositing a gate dielectric layer, a gate material layer, and a selective hard mask on the substrate 12, and then conducting a pattern transfer process by using a patterned resist (not shown) as mask to remove part of the hard mask, part of the gate material layer, and part of the gate dielectric layer through single or multiple etching process.

After stripping the patterned resist, a gate structure 22 composed of a patterned dielectric layer 24 and patterned gate material layer 26 is formed on the fin-shaped structure 14.

Figure 2:
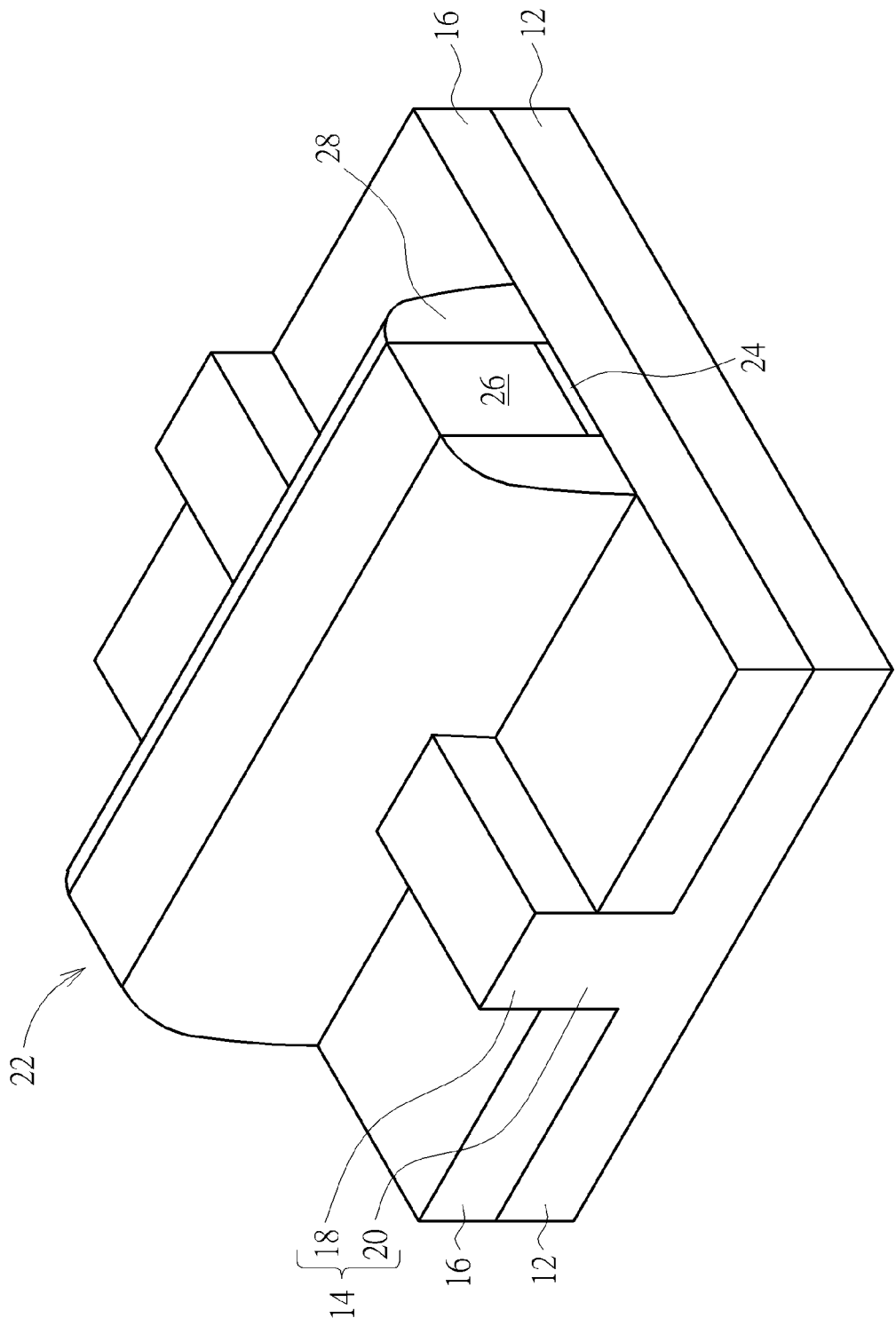

Next, as shown in FIG. 2, a liner is formed on the surface of the gate structure 22 and fin-shaped structure 14, and an etching process is conducted to remove part of the liner to form a first spacer 28 adjacent to the gate structure 22. In this embodiment, the first spacer 28 is preferably selected from the group consisting of $SiO_2$, SiN, SiON, and SiCN, and the etching process used to form the first spacer 28 preferably includes a dry etching process, but not limited thereto.

Figure 3:
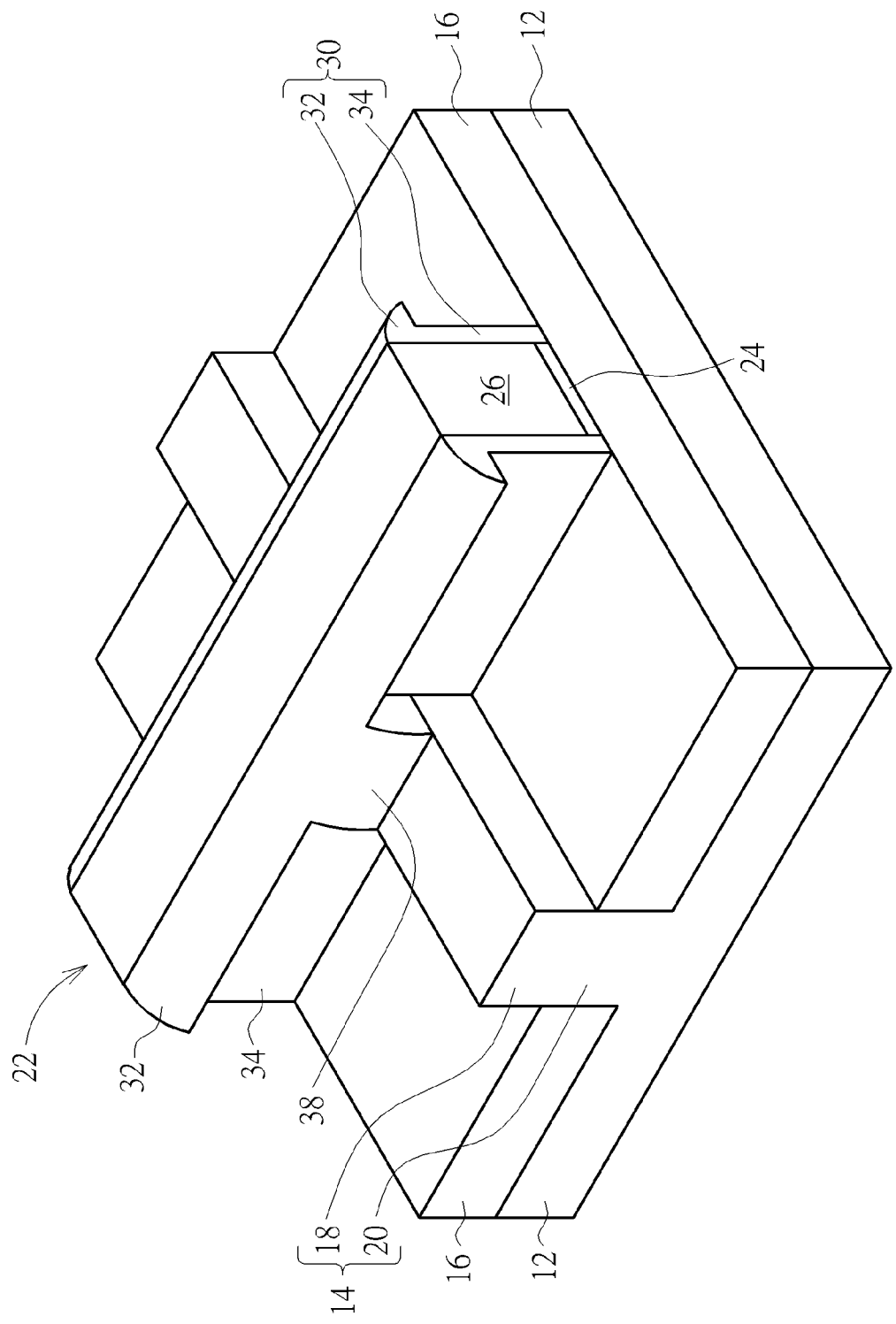

Next, as shown in FIG. 3, another etching process is conducted to remove part of the first spacer 28 to form a second spacer 30. Specifically, it would be desirable to selectively conduct a treatment process on the top portion of first spacer 28 before forming the second spacer 30. For instance, a sacrificial layer (not shown) or mask could be formed to cover the bottom portion of the first spacer 28 and expose the top portion of the first spacer 28, and processes including thermal treatment, oxidation treatment, nitridation treatment, plasma treatment, UV treatment, ion implantation, or combination thereof could be conducted to alter the surface property between the top portion and bottom portion of the first spacer 28 and create an etching selectivity between the top portion and bottom portion of the first spacer 28. The sacrificial layer is removed thereafter. Alternatively, according to an embodiment of the present invention, it would also be desirable to use the aforementioned treatment processes such as thermal treatment, plasma treatment, or ion implantation to change the surface property of the top portion of the first spacer 28 without forming any sacrificial layer or mask so that an etching selectivity is created between the top portion and bottom portion of the first spacer 28.

Next, a wet etching process is conducted to remove part of the bottom portion of the first spacer 28 for forming a second spacer 30. In this embodiment, the second spacer 30 preferably includes a top portion 32 and a bottom portion 34, in which the top portion 32 and the aforementioned first spacer 28 preferably include a half moon shaped cross-section while the bottom portion 34 includes a vertical and rectangular shaped cross-section.

Figure 4:
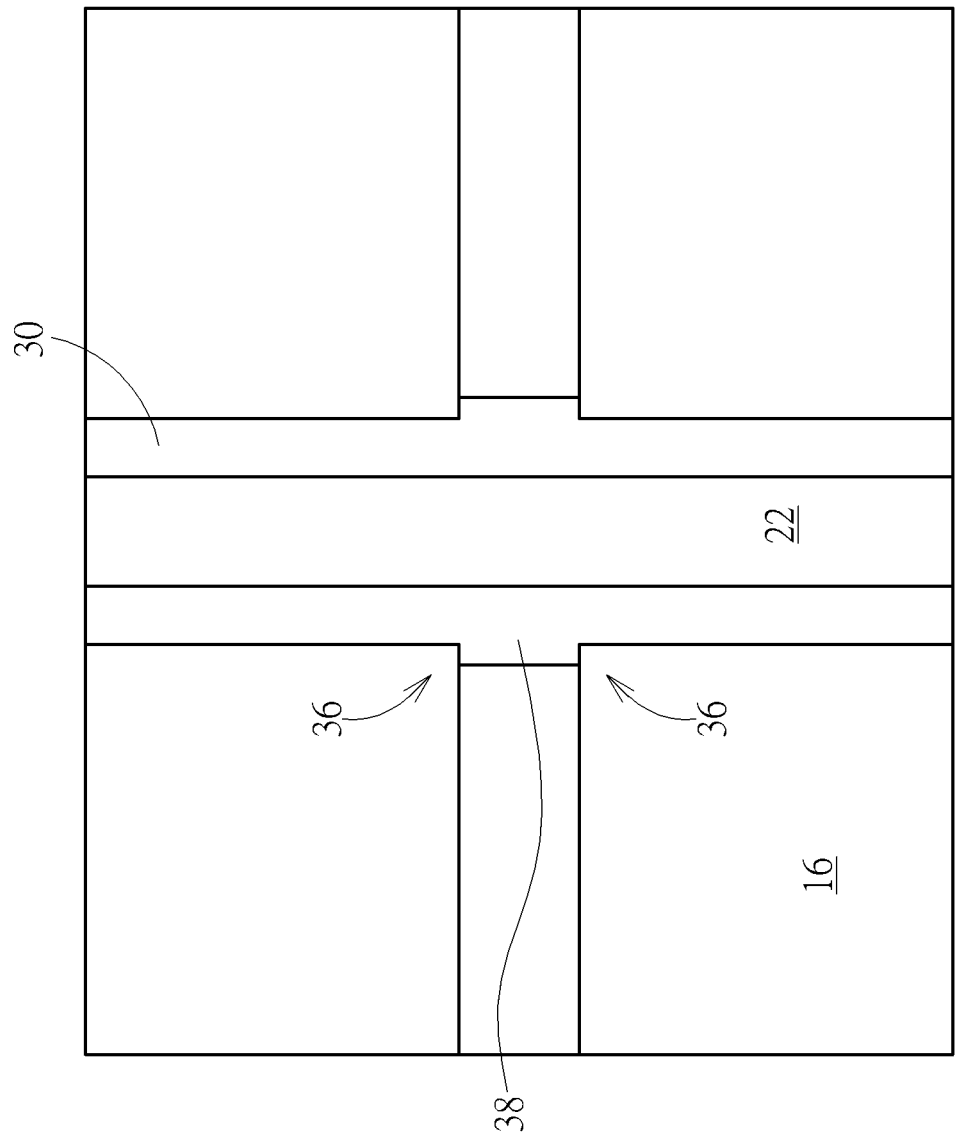

Referring to FIG. 4, FIG. 4 is a top view diagram of FIG. 3 according to an embodiment of the present invention. As shown in FIG. 4, the second spacer 30 after the aforementioned etching process, if viewed from a top-view perspective, preferably includes a step portion 36 and the two step portions 36 of the second spacer 30 on the same side together constitute a protruding portion 38 situating directly on top of the fin-shaped structure 14.

Figure 5:
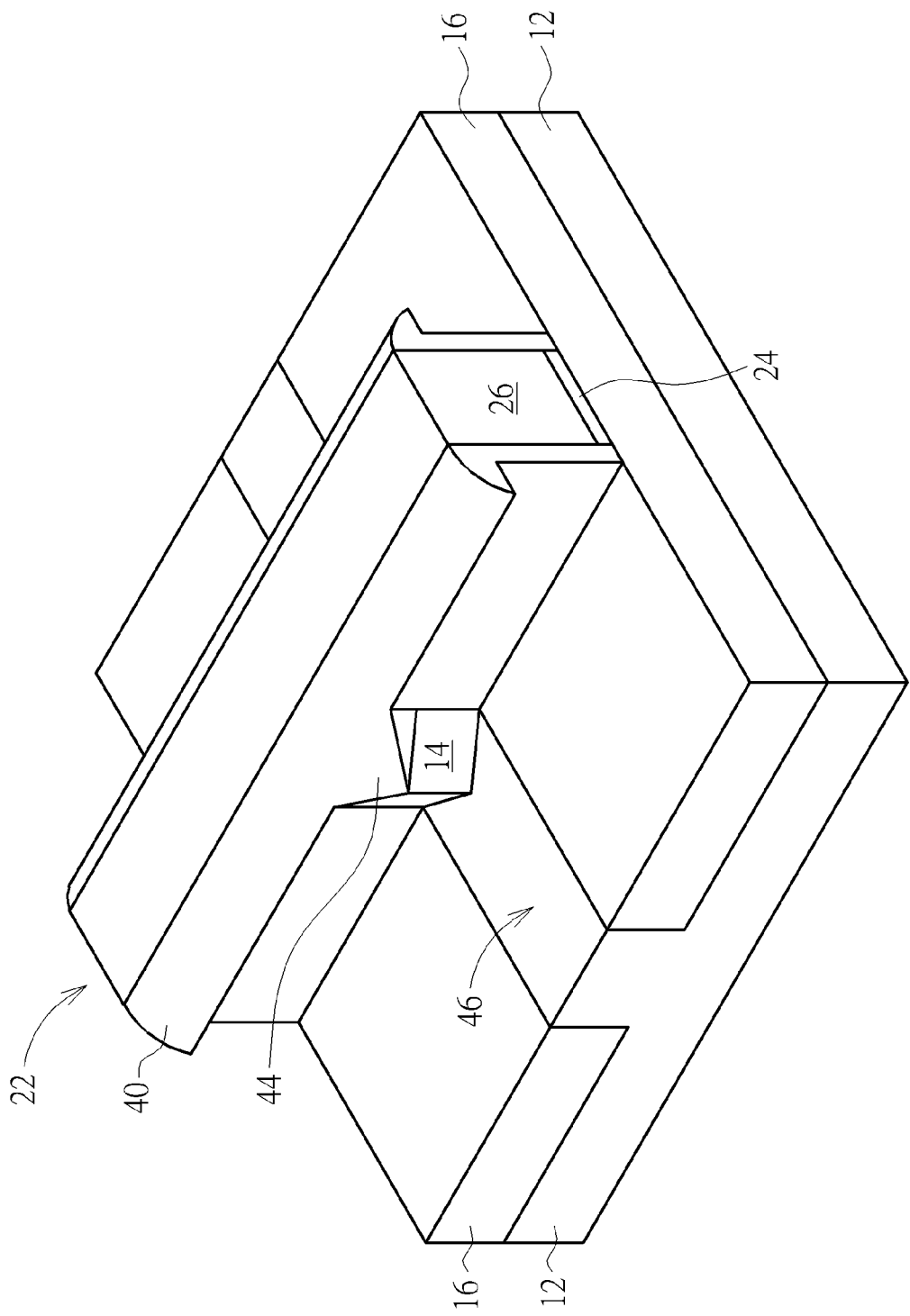

Next, as shown in FIG. 5, an etching process, such as a dry etching process is conducted to remove part of the second spacer 30 for forming a third spacer 40. Specifically, the dry etching process conducted at this stage preferably trims the step portions 36 of second spacer 30 so that the right angles of the step portions 36 are diminished to form into a third spacer 40 having a reverse V-shaped profile 42 and a triangular protruding portion 44, in which the triangular protruding portion 44 is formed solely on top of the fin-shaped structure 14. Next, another etching process is conducted to remove the fin-shaped structure 14 adjacent to two sides of the third spacer 40 for forming a recess 46. Preferably, the fin-shaped structure 14 under the reverse V-shaped profile 42 and triangular protruding portion 44 after the aforementioned etching process also includes or reveals a protruding triangular profile.

Figure 6:
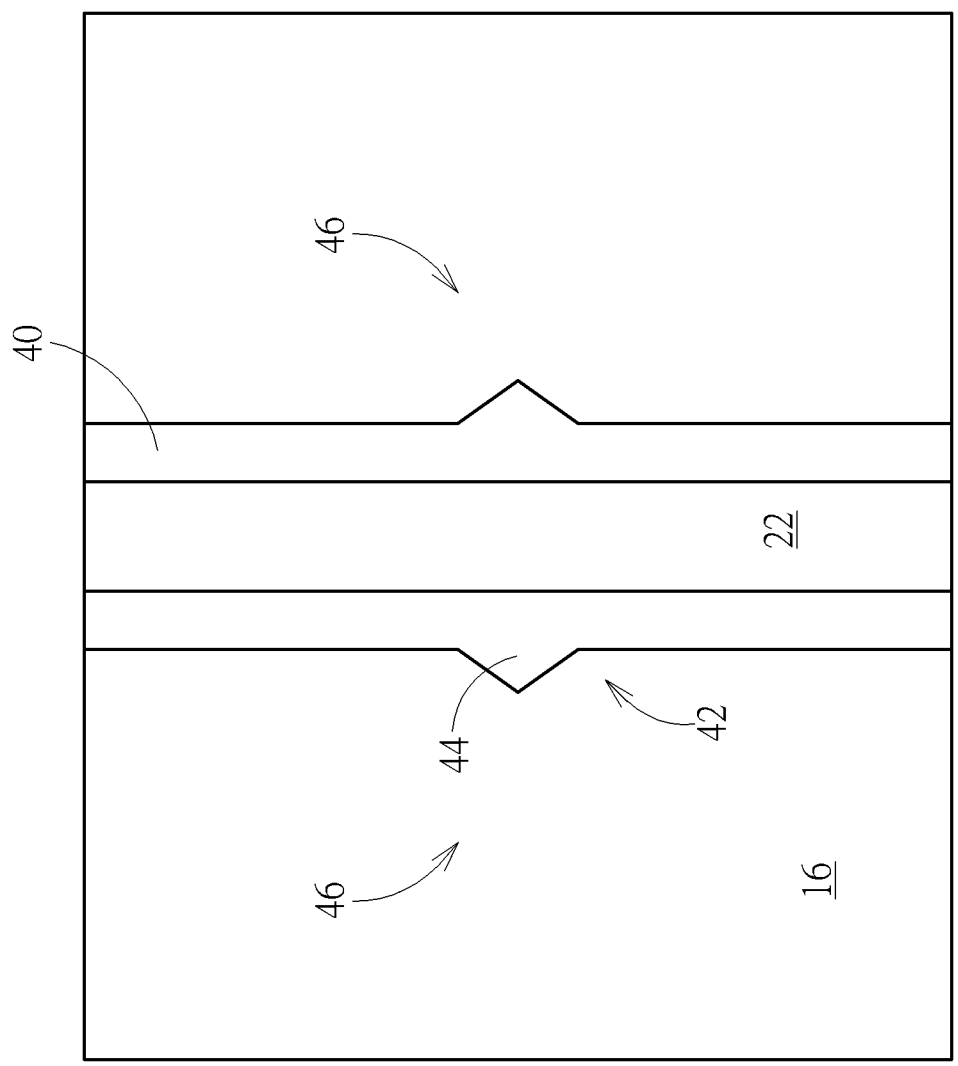

Referring to FIG. 6, FIG. 6 is a top view diagram of FIG. 5 according to an embodiment of the present invention. As shown in FIG. 6, the third spacer 40 after the aforementioned etching process, if viewed from the top, preferably includes a reverse V-shaped profile 42 and a triangular protruding portion 44 that was trimmed from the substantially rectangular protruding portion 38 from FIG. 4.

Figure 7:
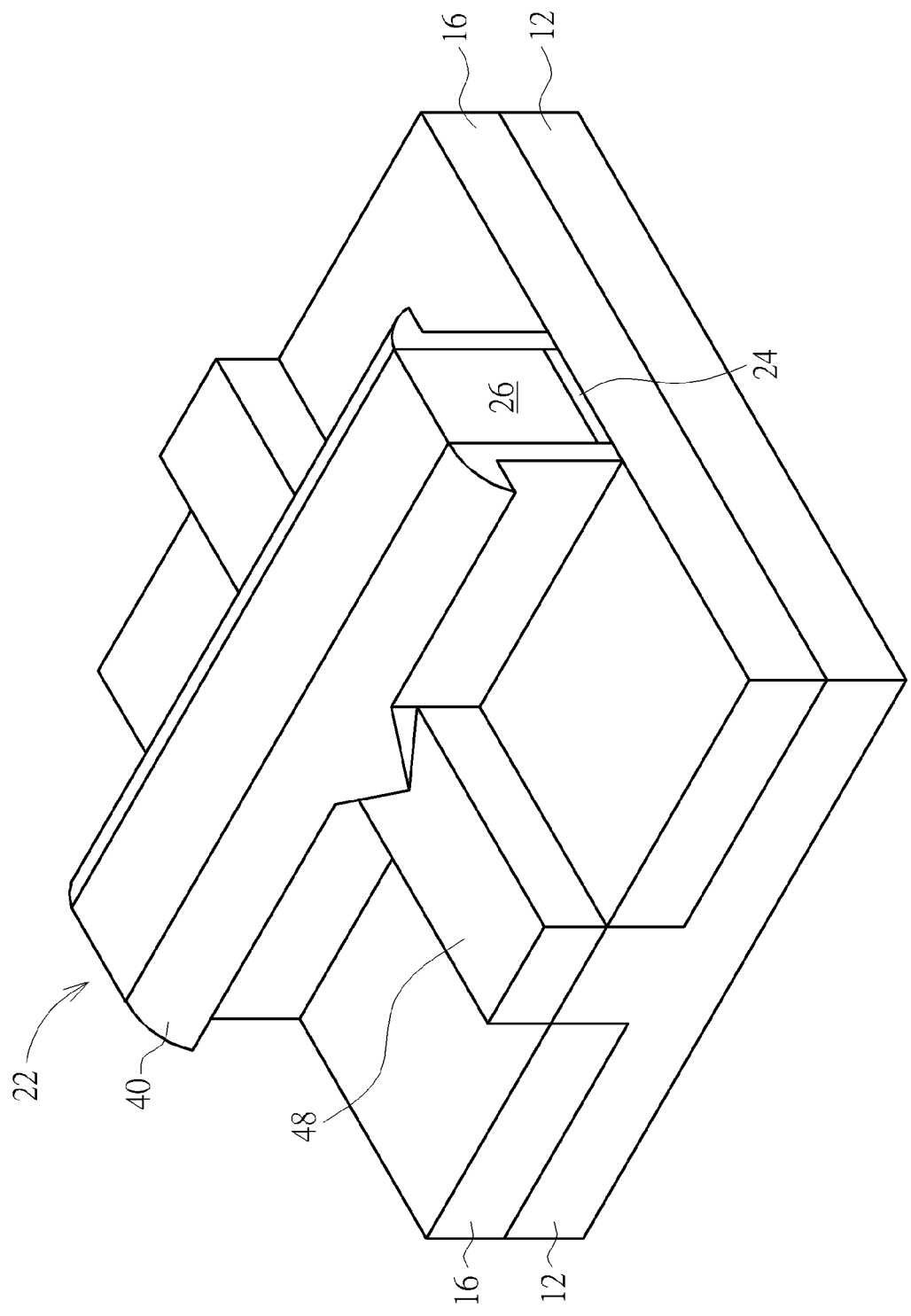
Figure 8:
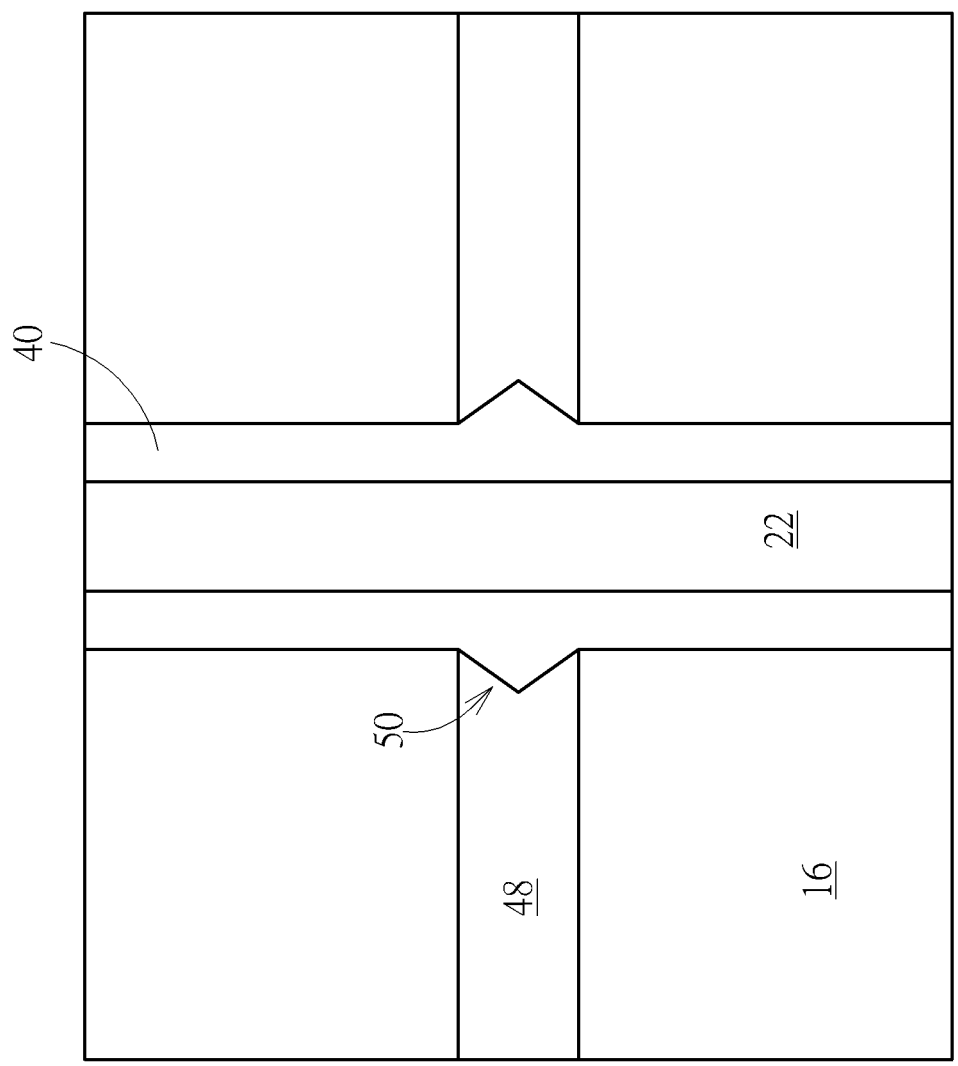

Next, as shown in FIG. 7, a selective epitaxial growth process is conducted to form an epitaxial layer 48 in the recess 46 adjacent to two sides of the third spacer 40, in which the epitaxial layer preferably includes GeO or SiGe, but not limited thereto. Referring to FIG. 8, FIG. 8 is a top view diagram of FIG. 7 according to an embodiment of the present invention. As shown in FIG. 8, since the epitaxial layer 48 is grown upward along the sidewalls of the third spacer 40 having reversed V-shaped profile 42, the epitaxial layer 48 preferably includes a V-shaped profile 50 corresponding to the reverse V-shaped profile 42 of third spacer 40, in which the reverse V-shaped profile 42 and the V-shaped profile 50 contact each other.

According to an embodiment of the present invention, a doping process could be conducted along with an anneal process during the formation of epitaxial layer 48 to implant dopants into the epitaxial layer 48 for forming a source/drain region, or a doping process could be conducted along with an anneal process after the formation of epitaxial layer 48 to form a source/drain region in the epitaxial layer 48, which are all within the scope of the present invention. Next, a contact etch stop layer (CESL) and an interlayer dielectric (ILD) layer could be formed on the gate structure 22 and epitaxial layer 48, a replacement metal gate (RMG) process could be conducted to transform the gate structure 22 made of polysilicon into metal gate, and finally contact plugs could be formed in the ILD layer to electrically connect to the epitaxial layer 48 and/or source/drain region. This completes the fabrication of a semiconductor device according to a preferred embodiment of the present invention.

Figure 9:
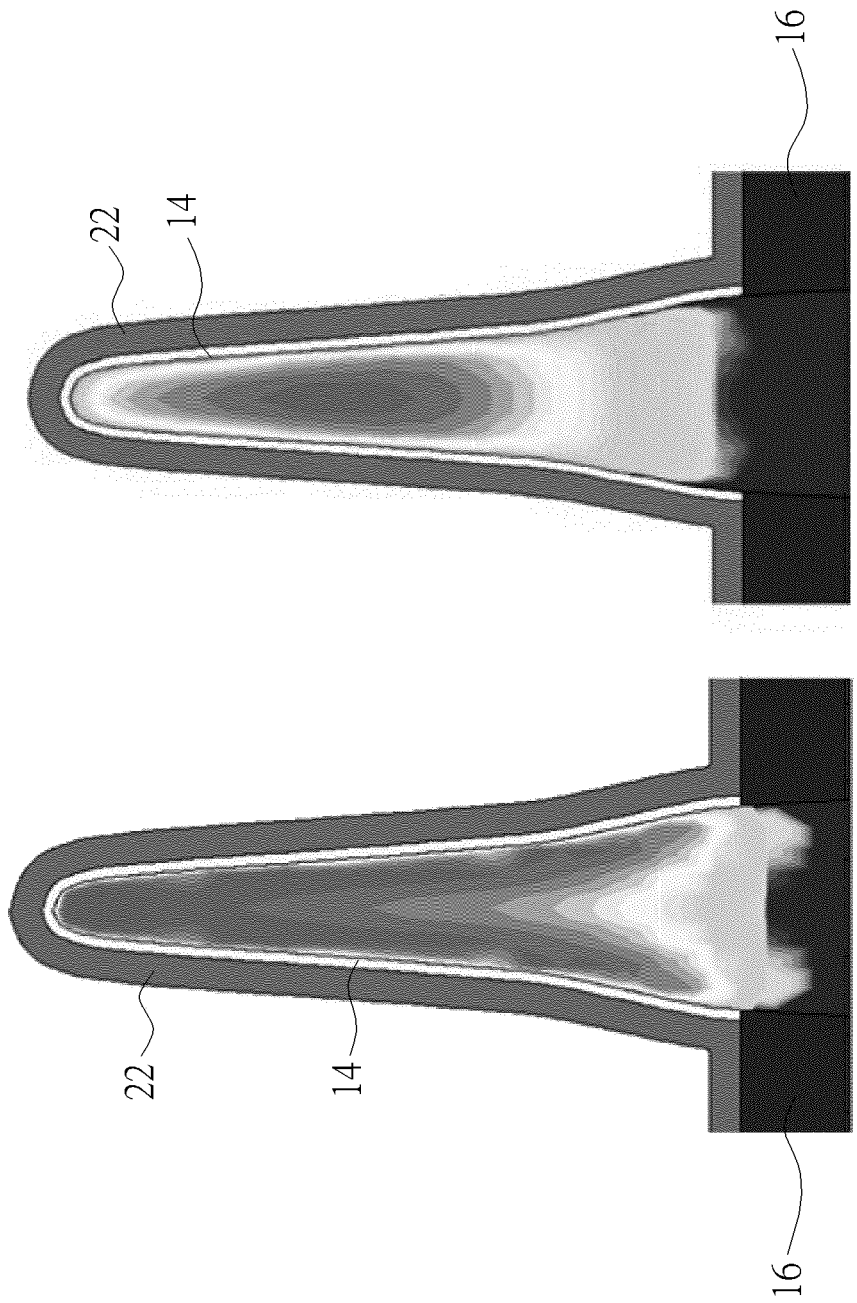
FIG. 9 illustrates a density distribution of electrical current relative to the fin-shaped structure during an operation of the FinFET device.
Figure 10:
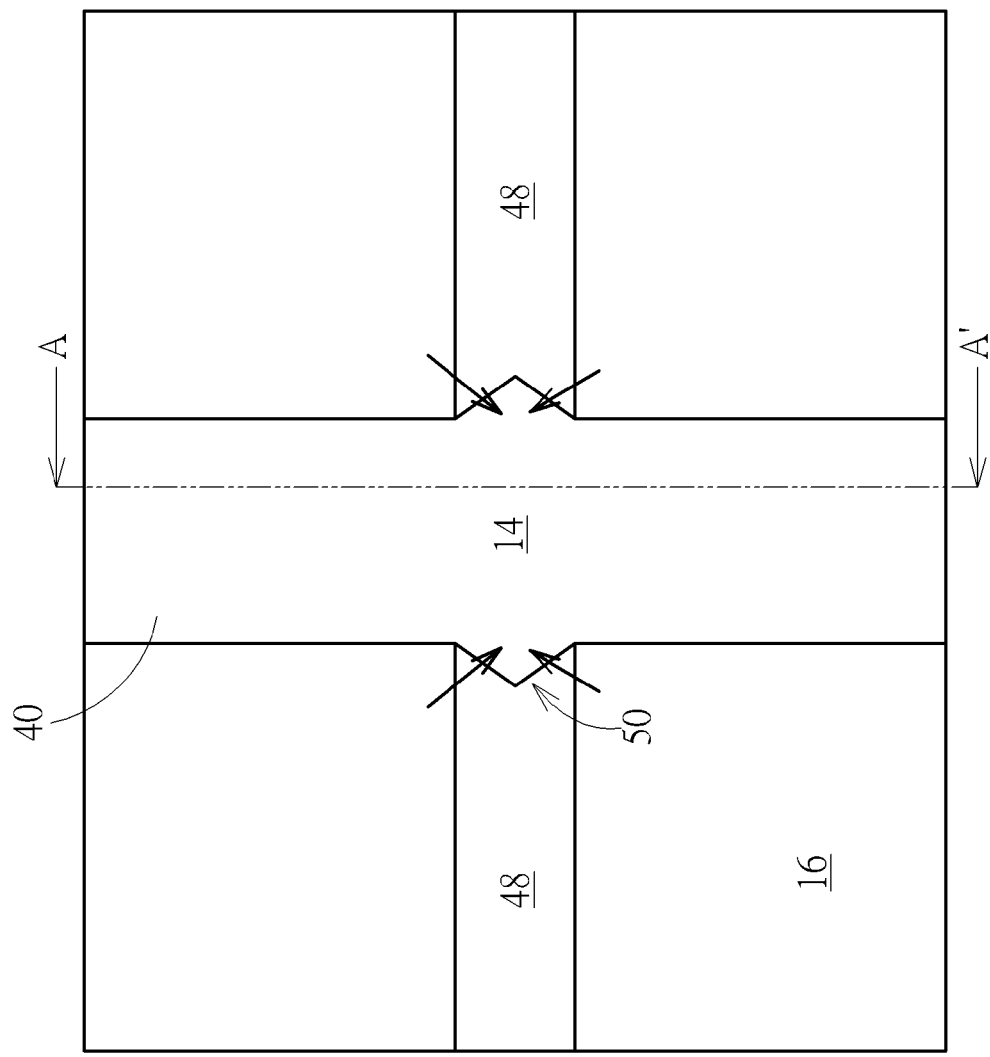
FIG. 10 illustrates an enlarged view of the fin-shaped structure and epitaxial layer from an embodiment of the present invention.

Referring to FIGS. 9-10, FIG. 9 illustrates a density distribution of electrical current relative to the fin-shaped structure during an operation of the FinFET device, in which the left portion of FIG. 9 illustrates the density distribution of electrical current during an on-state while the right portion illustrates the density distribution of electrical current during an off-state. FIG. 10 illustrates an enlarged view of the fin-shaped structure 14 and epitaxial layer 48 from the aforementioned embodiment, in which the fin-shaped structure 14 shown in FIG. 9 is obtained along the sectional line AA' of FIG. 10. As shown in FIG. 9, a fin-shaped structures 14 disposed on the substrate 12 is shown on both left portion and right portion, a STI 16 is disposed around the fin-shaped structure 14, and a gate structure 22 is disposed on the fin-shaped structure 14. As shown in the left portion, electrical currents are gathered or concentrated relative to the surface of the fin-shaped structure 14 during an on-state. The right portion on the other hand shows that electrical currents are gathered or concentrated in the central portion of the fin-shaped structure 14 during an off-state.

Overall, in order to allow epitaxial layer to exert maximum stress to the region having high electrical current or concentrated currents during an on-state and at the same time prevent the region having concentrated electrical currents to be overly compressed during an off-state, the present invention conducts the aforementioned process to form an epitaxial structure that is able to adapt to different density distribution of electrical currents in FinFET device under different conditions.

More specifically, the present invention preferably forms an epitaxial layer 48 adjacent to two sides of the gate structure 22 by following the aforementioned fabrication process or adjacent to two sides of the fin-shaped structure 14 shown in FIG. 10, in which the epitaxial layer 48 includes a V-shaped profile when viewed from a top-view perspective. According to the preferred embodiment of the present invention, since the V-shaped profile 50 of the epitaxial layer 48 allows the epitaxial layer 48 to extend inward to the channel region along the edge of the fin-shaped structure 14 and at the same time shrink backward relative to the central region of the fin-shaped structure 14, it would be desirable to apply more stress to the region having concentrated currents or edges of the fin-shaped structures 14 during an on-state according to the arrow direction shown in FIG. 10, and at the same time prevent exerting too much stress to the region having high currents or central region of the fin-shaped structure 14 during an off-state. This improves the overall performance of the device substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate;
   forming a fin-shaped structure on the substrate;
   forming a gate structure on the fin-shaped structure; and
   forming an epitaxial layer adjacent to the gate structure, wherein the epitaxial layer comprises a V-shaped profile viewing from a top cross-sectional view of the device.

2. The method of claim 1, further comprising:
   forming a liner on the gate structure;
   performing a first etching process to remove part of the liner for forming a first spacer; and
   performing a second etching process to remove part of the first spacer to form a second spacer, wherein the second spacer comprises a step-shaped profile viewing from the top cross-sectional view of the device.

3. The method of claim 2, wherein the second etching process removes part of a bottom portion of the first spacer.

4. The method of claim 2, wherein the first etching process comprises a dry etching process.

5. The method of claim 2, wherein the second etching process comprises a wet etching process.

6. The method of claim 2, further comprising performing a third etching process to remove part of the second spacer for forming a third spacer.

7. The method of claim 6, wherein the third spacer comprises a reverse V-shaped profile viewing from the top cross-sectional view of the device.

8. The method of claim 7, wherein the reverse V-shaped profile of the third spacer contacts the V-shaped profile of the epitaxial layer directly.

9. The method of claim 2, further comprising:
   performing a fourth etching process to remove part of the fin-shaped structure for forming a recess; and
   forming the epitaxial layer in the recess.

10. A semiconductor device, comprising:
    a substrate;
    a fin-shaped structure on the substrate;
    a gate structure on the fin-shaped structure; and
    an epitaxial layer adjacent to two sides of the gate structure, wherein the epitaxial layer comprises a V-shaped profile viewing from a top cross-sectional view of the device.

11. The semiconductor device of claim 10, further comprising a spacer adjacent the gate structure, wherein the spacer comprises a reverse V-shaped profile viewing from the top cross-sectional view of the device.

12. The semiconductor device of claim 11, wherein the reverse V-shaped profile of the spacer contacts the V-shaped profile of the epitaxial layer directly.

* * * * *